United States Patent
Heide et al.

(10) Patent No.: US 6,545,634 B1
(45) Date of Patent: Apr. 8, 2003

(54) METHOD FOR DETECTING AND CORRECTING NON-LINEARITIES IN RADIO-FREQUENCY, VOLTAGE CONTROLLED OSCILLATORS

(75) Inventors: Patric Heide, Neubiberg (DE); Matthias Huschenbett, Regensburg (DE); Martin Kunert, Neutraubling (DE); Richard Roskosch, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/857,704

(22) PCT Filed: Dec. 1, 1999

(86) PCT No.: PCT/DE99/03833

§ 371 (c)(1),
(2), (4) Date: Aug. 17, 2001

(87) PCT Pub. No.: WO00/35076

PCT Pub. Date: Jun. 15, 2000

(30) Foreign Application Priority Data

Dec. 10, 1998 (DE) .......................... 198 57 040

(51) Int. Cl.$^7$ .................. G01S 13/08; H03D 3/02
(52) U.S. Cl. ............... 342/128; 342/135; 331/178; 329/336
(58) Field of Search ................ 342/128, 135, 342/174; 329/303, 336; 331/177, 178

(56) References Cited

U.S. PATENT DOCUMENTS

| | | | | |
|---|---|---|---|---|
| 4,435,682 A | * | 3/1984 | Boudault et al. | ............ 329/303 |
| 4,468,638 A | | 8/1984 | Kyriakos | |
| 4,499,435 A | | 2/1985 | Thomson et al. | |
| 4,758,801 A | * | 7/1988 | Draxelmayr | ................. 331/10 |
| 4,926,133 A | * | 5/1990 | Koga | .......................... 329/336 |
| 5,694,132 A | * | 12/1997 | Johnson | ...................... 342/128 |
| 6,072,426 A | * | 6/2000 | Roos | ........................... 342/174 |
| 6,313,709 B1 | * | 11/2001 | Nishimura et al. | ......... 331/1 A |
| 6,384,770 B1 | * | 5/2002 | de Gouy et al. | ............ 342/120 |

FOREIGN PATENT DOCUMENTS

| | | |
|---|---|---|
| DE | 39 35 829 A1 | 5/1991 |
| DE | 39 38 250 C1 | 5/1996 |
| EP | 0 042 641 | 12/1981 |
| EP | 0 727 051 B1 | 8/1996 |

OTHER PUBLICATIONS

Lowbridge et al., "A Low Cost mm–Wave Cruise Control System for Automotive Applications", *Microwave Journal*, pp. 24–36 (Oct. 1993).

Nalezinski et al., "Novel Heterodyne 24 GHZ FMCW Radar Front–End with High–Precision 2.45 GHZ Saw Reference Path", 9th Conference and Exhibition on Microwaves, Radio Communication and Electromagnetic Compatability Proceedings, pp. 30–35 (Apr. 22–24, 1997).

Vossiek et al., "Signal Processing Methods for Millimetrewave FMCW Radar with High Distance and Doppler Resolution", 27th European Microwave Conference, pp. 1127–1131, (1997).

* cited by examiner

Primary Examiner—Thomas H. Tarcza
Assistant Examiner—Brian Andrea
(74) Attorney, Agent, or Firm—Morrison & Foerster LLP

(57) ABSTRACT

A method for detecting and correcting non-linearities in radio-frequency, voltage controlled oscillators provides for digitization of the frequency signal by feeding the undelayed frequency signal and a delayed frequency signal generated therefrom into EXOR gates. The digital pulses produced therefrom are converted using a low pass filter into a proportional DC voltage value which is proportional to the oscillator frequency and is used as a basis for producing a correction value for the frequency control of the oscillator.

11 Claims, 2 Drawing Sheets

METHOD FOR DETECTING AND CORRECTING NON-LINEARITIES IN RADIO-FREQUENCY, VOLTAGE CONTROLLED OSCILLATORS

CLAIM FOR PRIORITY

This application claims priority to International Application No. PCT/DE99/03833 which was published in the German language on Jun. 15, 2000.

TECHNICAL FIELD OF THE INVENTION

The invention relates to a method for detecting and correcting non-linearities in radio-frequency, voltage controlled oscillators, and in particular, radio-frequency, coltage controlled osilators in the form of microwave oscillators for radar applications in motor vehicles.

BACKGROUND OF THE INVENTION

Radar technology is particularly suitable for course use in automobiles or in industry for the purpose of contactless determination of distance, speed, nature, presence or the like of objects. In this case, functional scope, measurement accuracy and costs for radar sensors are fundamentally dependent on the modulation method used and on the associated radar signal processing.

In the context of the FMCW radar principle (FMCW=frequency modulated continuous wave) frequently used for distance measurement, the quality of the measured value depends, among other things, on the frequency accuracy and stability of the microwave oscillator. In practice, these variables are affected in particular by temperature drift, noise and non-linearities of the oscillator, and therefore generally need to be monitored.

Contactless distance and speed measurement using radar has been known for a long time and originates from military technology. In the case of the aforementioned FMCW method, on the basis of which the method described in EP 0 727 051 B1 for operating a radar instrument works, a frequency modulated radar signal is transmitted which is received with a shifting phase and frequency. The measured phase and frequency difference, which is typically in the kHz range, is proportional to the object distance, assuming that frequency modulation takes place linearly over time. In practice, this prerequisite is not typically satisfied.

The non-linearities during frequency modulation are primarily caused by the voltage controlled oscillators, since the components thereof have a non-linear voltage/frequency characteristic curve. In addition, these oscillators have more or less pronounced phase noise which has a much higher frequency (compared to the voltage dependent non-linearity) and is generally negligible at short distances—the "correlation length" of the radar.

By contrast, it is necessary to compensate for the voltage dependent non-linearities in order to be able to carry out troublefree object detection using the radar device. Since the non-linearities change as a result of, for example, effects of temperature or aging, correction needs to be constantly adjusted in order to keep linearity differences in the tolerance range of a maximum of 1% of the measured value.

Appropriate correction methods are known from the prior art:

An oscillator can be driven using a once pre-determined, pre-distorted control voltage. This method is suitable only to a limited extent, however, since manufacturing scatter of the oscillator and also subsequent frequency fluctuations and temperature drifts cannot be compensated for, owing to the design.

The technical paper by P. Lowbridge et al. "A Low Cost mm-Wave Cruise Control System for Automotive Applications" in Microwave Journal, October 1993, discloses the use of a control loop comprising a PLL (=Phase locked Loop) or AFC (=Automatic Frequency Control) circuit. In both methods, a frequency dependent reference voltage is produced which, in combination with a linear ramp, adapts the driving voltage of the oscillator such that the frequency modulation has a linear course over time. Such control electronics have the drawback of being too expensive and inflexible, however.

The technical publication by Nalezinski et al. "Novel Heterodyne 24 GHz FMCW Radar with High-Precision 2.4 GHz SAW Reference Path" in MIOP'97 Conference Proceedings discloses the use of a reference path within the radar arrangement which, on account of its defined and precisely known delay time, corresponds to the disturbance-variable-free reference signal of a virtual reflection point whose distance is determined by a nominal delay time. Analysis and evaluation of this signal allows correction of real signals using similar delay times. However, this method is disadvantageous because the additional reference path and its associated evaluation unit are operationally complex and therefore cost intensive. The latter drawback is not acceptable, particularly with regard to the use of such radar sensors as a mass produced component in motor vehicles.

SUMMARY OF THE INVENTION

In one embodiment of the invention, there is a method for detecting and correcting non-linearities in radio-frequency, voltage controlled oscillators. The method includes, for example, tapping a frequency signal off from one of the oscillators, supplying the frequency signal to the first input of a logic EXOR gate, supplying simultaneously the frequency signal to a delay element, producing a delayed frequency signal, and supplying the delayed frequency signal to the second input of the logic EXOR gate, converting the digital pulses produced at an output of the EXOR gate into a DC voltage value proportional to the frequency of the oscillator frequency signal using a low pass filter; and generating a correction value for frequency control of the oscillator on the basis of the DC voltage value in order to set the oscillator frequency to a nominal value.

In one aspect of the invention, the frequency signal tapped off is divided down by a prescaler value using a frequency divider.

In another aspect of the invention, the frequency signal tapped off is divided down from a frequency in the GHz range to a frequency in the MHz range using the frequency divider.

In still another aspect of the invention, an edge profile of the frequency signal is steepened using a comparator.

In yet another aspect of the invention, the frequency signal is supplied to the EXOR gate via a multiplexer chip.

In another aspect of the invention, feeding at least one reference frequency signal derived from the radar sensor into the circuit in order to convert the frequency signal into the DC voltage value.

In still another aspect of the invention, feeding and processing two different reference frequency signals having frequencies in the range of the frequency signal into the module comprising EXOR gate and delay element via the multiplexer chip.

In another aspect of the invention, the correction value for the frequency control of the oscillator is produced using a microcontroller.

In yet another aspect of the invention, the reference frequency signals are derived from reference signals available in the microcontroller.

In another aspect of the invention, feeding and processing two different reference frequency signals having frequencies in the range of the frequency signal into the module comprising EXOR gate and delay element via the multiplexer chip.

In still another aspect of the invention, the reference frequency signals are derived from reference signals available in the microcontroller.

BRIEF DESCRIPTION OF THE DRAWINGS

More detailed explanations and advantages relating to the invention can be found in the description below, which explains exemplary embodiments of the invention in more detail with reference to the appended drawings, in which.

DETAILED DESCRIPTION OF THE PREFERRED EMBODIMENTS

The invention is based on specifying a method for detecting and correcting non-linearities in radio-frequency, voltage controlled oscillators which is extremely simple, and hence economical, to implement in a powerful radar sensor.

In this embodiment, the invention converts the oscillator's frequency signal using a logical EXOR gate, by splitting the frequency signal into an undelayed input signal and a delayed signal for the gate, into digital pulses at the output of the EXOR gate. The pulse is converted using a low pass filter into a DC voltage value which is proportional to the frequency of the oscillator frequency signal. The frequency produced at a particular driving voltage for the oscillator is thus known and, if differing from a nominal value, can be changed to this nominal value by generating a correction value for the frequency control of the oscillator. The corresponding correction values can be derived using compensation methods, such as are known, by way of example, from the technical contribution by M. Vossiek et al. "Signal Processing Methods for Millimeterwave FMCW Radar with High Distance and Doppler Resolution" in 27$^{th}$ European Microwave Conference 1997.

The method according to the invention can be used to achieve a degree of frequency modulation linearity which is more than sufficient for practical applications. Specifically, in the case of radar applications in motor vehicles, the invention can be implemented using a correction circuit which is simple in terms of equipment.

With respect to the calibration of the frequency detection and correction, the present invention alternative methods of conversion of the frequency signal into a DC voltage value, proportional thereto, using an EXOR gate, and can also be used for another kind of frequency/voltage conversion. By way of example, commercially available, slower frequency/voltage converters can be calibrated using a reference frequency derived from the clock frequency of the microcontroller for the radar sensor.

Figure 1:
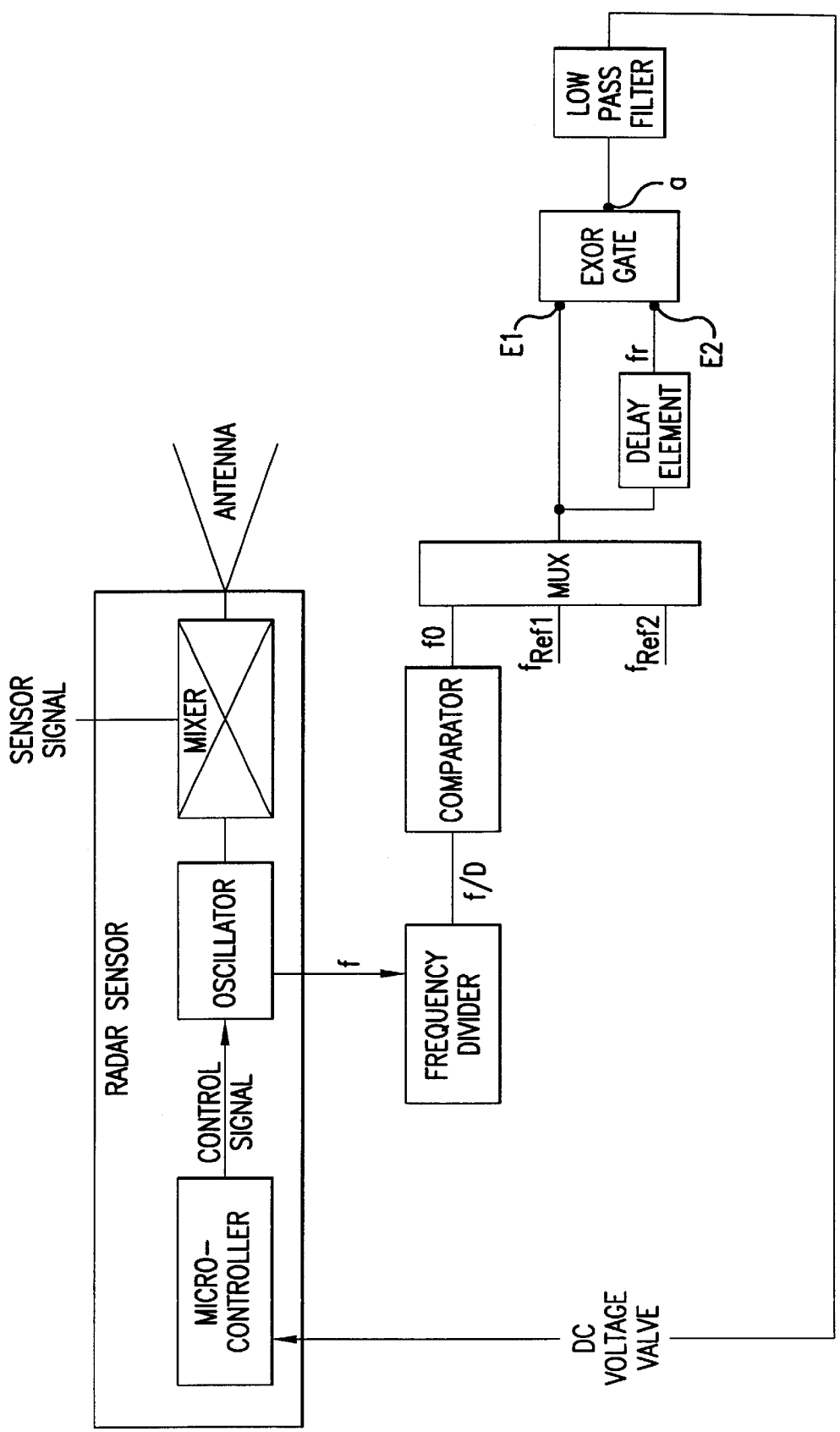
FIG. 1 shows a block diagram of a radar sensor having an associated apparatus for detecting and correcting non-linearities in the radar oscillator.

As FIG. 1 shows, a conventional radar sensor RS forms the equipment basis for carrying out and implementing the method according to the invention. The radar sensor RS has a frequency modulated oscillator MO, a radar receiver or mixer MIX and an antenna A. The sensor signal SS is applied to the mixer MIX and can be processed further in an appropriate manner for evaluation purposes, for example in a distance radar in motor vehicles.

The frequency modulated oscillator MO is frequency modulated by a ramp-shaped control signal US which is produced by a microcontroller $\mu$P. If the control signal US were strictly linear, then the problems outlined in the introduction would arise on account of the non-linearities in the characteristic curve of the oscillator MO. For at least this reason, the control signal US is corrected using the inventive method described below.

The oscillator MO thus has a tap which is used to tap off a frequency signal f. In the exemplary applications considered, this signal is in the GHz range. It is supplied to a frequency divider FT1 which divides the tapped-off frequency signal f by a prescaler value D in the order of magnitude of 100 to 1000 such that the frequency of the divided frequency signal is in the MHz range.

The frequency signal f/D divided in this manner is conditioned in a comparator K, connected downstream of the frequency divider FT1, such that the gradient of its edges is increased. The frequency signal f0 conditioned in this manner is subsequently supplied to the first input E1 of a logic EXOR gate EX via a multiplexer chip MUX. At the same time, the frequency signal f0 supplied via the multiplexer chip MUX is routed to a delay element T which produces a frequency signal $F_v$ which is delayed with respect to the frequency signal f0. This frequency signal $f_v$ is supplied to the second input E2 of the EXOR gate EX.

On account of the logic combination formed by the EXOR gate between the frequency signals f0 and $f_v$, the output a of the EXOR gate EX will produce digital pulses DI whose repetition rate corresponds to the frequency of the divided frequency signal f/D.

These digital pulses DI are supplied to a low pass filter TP and are converted thereby into a DC voltage value UMO which is proportional to the frequency f of the microwave oscillator MO. The oscillator's frequency produced at a particular value of the control signal US is thus known and can be adapted, by generating appropriate correction values, in the microcontroller $\mu$P on the basis of the compensation methods specified in M. Vossiek et al. (loc. cit) such that the frequency response of the oscillator MO is strictly linear within prescribed maximum deviations.

Figure 2:
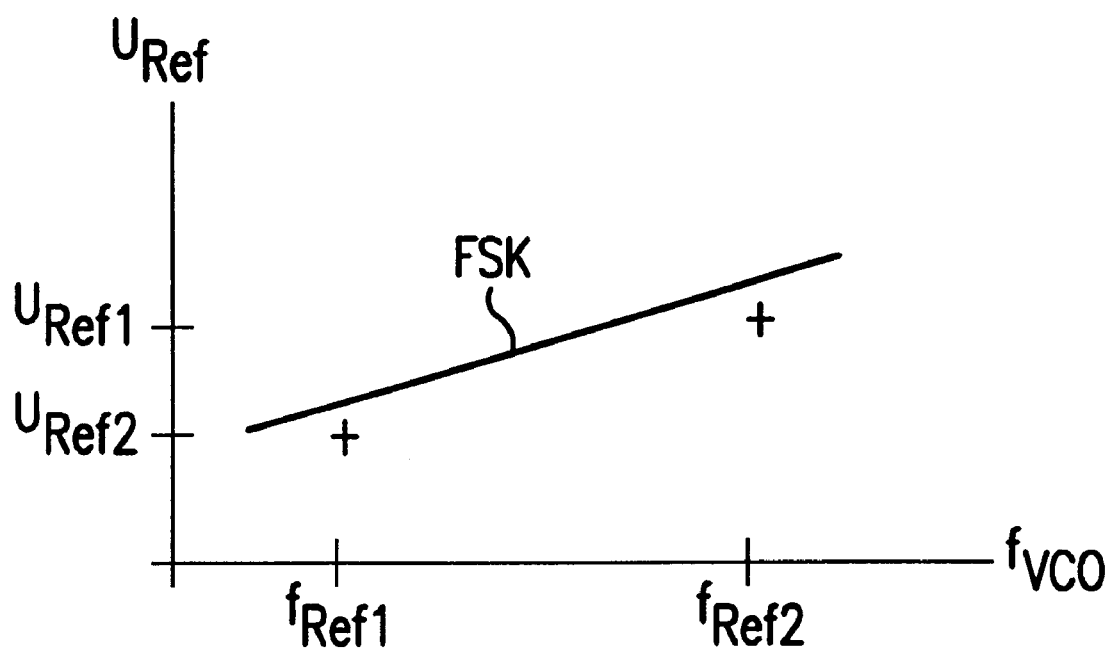
FIG. 2 shows a frequency/voltage graph.

Commercially available digital delay elements T, which typically produce a signal delay by a fixed time of, by way of example, 10 to 20 nsec of the signal fed, have a manufacturing scatter and a temperature drift. This inaccuracy in the delay produced by the delay element T results in the accuracy of frequency measurement being limited, which needs to be prevented. To this extent, as an additional advantageous measure in the method according to the invention, calibration is carried out within the context of frequency detection and correction. In this case, two reference frequencies $f_{Ref1}$ and $f_{Ref2}$ are fed into the module comprising EXOR gate EX and delay element T via the multiplexer chip MUX, and the respective output signal then produced by the EXOR gate EX is converted into associated DC voltage values $U_{ref1}$ and $U_{ref2}$ using the low pass filter TP. Assuming high linearity for the conversion of the digital pulses DI from the module comprising EXOR gate EX, delay element T and low pass filter TP, it is possible to determine the frequency/voltage characteristic curve FSK of the arrangement exactly. This is shown obviously in FIG. 2. Typically, this calibration allows the residual error during frequency measurement to be forced down below 1%, which may regarded as sufficient for practical application—as discussed in the introduction.

In addition, the two reference frequencies $f_{Ref1}$ and $f_{Ref2}$ are situated in the same frequency range as the divided frequency signal f/D and are expediently crystal stabilized frequencies. These can be derived from the clocking of the microcontroller μP, for example.

What is claimed is:

1. A method for detecting and correcting non-linearities in radio-frequency, voltage controlled oscillators, comprising:

tapping a frequency signal off from one of the oscillators;

supplying the frequency signal to the first input of a logic EXOR gate;

supplying simultaneously the frequency signal to a delay element, producing a delayed frequency signal, and supplying the delayed frequency signal to the second input of the logic EXOR gate;

converting digital pulses produced at an output of the EXOR gate into a DC voltage value proportional to the frequency of the oscillator frequency signal using a low pass filter; and generating a correction value for frequency control of the oscillator on the basis of the DC voltage value in order to set the oscillator frequency to a nominal value.

2. The method as claimed in claim 1, wherein the frequency signal tapped off is divided down by a prescaler value using a frequency divider.

3. The method as claimed in claim 2, wherein the frequency signal tapped off is divided down from a frequency in the GHz range to a frequency in the MHz range using the frequency divider.

4. The method as claimed in claim 1, wherein an edge profile of the frequency signal is steepened using a comparator.

5. The method as claimed in claim 1, wherein the frequency signal is supplied to the EXOR gate via a multiplexer chip.

6. The method as claimed in claim 1, further comprising feeding at least one reference frequency signal derived from the radar sensor into the circuit in order to convert the frequency signal into the DC voltage value.

7. The method as claimed in claim 5, further comprising:

feeding and processing two different reference frequency signals having frequencies in the range of the frequency signal into the module comprising EXOR gate and delay element via the multiplexer chip.

8. The method as claimed in claim 1, wherein the correction value for the frequency control of the oscillator is produced using a microcontroller.

9. The method as claimed in claim 7, wherein the reference frequency signals are derived from reference signals available in the microcontroller.

10. The method as claimed in claim 6, further comprising:

feeding and processing two different reference frequency signals having frequencies in the range of the frequency signal into the module comprising EXOR gate and delay element via the multiplexer chip.

11. The method as claimed in claim 8, wherein the reference frequency signals are derived from reference signals available in the microcontroller.

* * * * *